United States Patent
Yu et al.

(10) Patent No.: US 9,379,693 B2
(45) Date of Patent: Jun. 28, 2016

(54) SELF BIAS BUFFER CIRCUIT AND MEMORY DEVICE INCLUDING THE SAME

(71) Applicant: SAMSUNG ELECTRONICS CO., LTD., Suwon-si, Gyeonggi-do (KR)

(72) Inventors: Hye-Seung Yu, Goyang-si (KR); Jun-Bae Kim, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/505,614

(22) Filed: Oct. 3, 2014

(65) Prior Publication Data

US 2015/0194195 A1    Jul. 9, 2015

(30) Foreign Application Priority Data

Jan. 3, 2014  (KR) .................. 10-2014-0000528

(51) Int. Cl.
*G11C 5/14* (2006.01)
*H03K 17/041* (2006.01)
*G11C 7/10* (2006.01)

(52) U.S. Cl.
CPC ........ *H03K 17/04106* (2013.01); *G11C 7/1084* (2013.01); *G11C 5/147* (2013.01)

(58) Field of Classification Search
CPC .................................. G11C 5/14; G11C 7/222
USPC ............................................. 365/189.05, 226
See application file for complete search history.

(56) References Cited

U.S. PATENT DOCUMENTS

| | | | | |
|---|---|---|---|---|
| 5,179,297 A * | 1/1993 | Hsueh | .................. | H03K 17/102 327/530 |
| 5,278,467 A * | 1/1994 | Nedwek | ............... | H03K 5/2481 327/52 |
| 5,953,276 A | 9/1999 | Baker | | |
| 6,930,550 B1 * | 8/2005 | Wu | .................. | H03K 5/151 330/253 |
| 7,349,681 B2 | 3/2008 | Ou | | |
| 7,459,944 B2 * | 12/2008 | Cowles | .......... | H03K 19/018528 327/108 |
| 2005/0225364 A1 * | 10/2005 | Baker | ................. | G11C 7/1084 327/112 |
| 2006/0012429 A1 | 1/2006 | Kim | | |
| 2006/0203571 A1 * | 9/2006 | Baker | ................. | G11C 7/1051 365/189.05 |
| 2007/0164812 A1 * | 7/2007 | Rao | ........................ | G05F 3/205 327/543 |
| 2012/0170344 A1 * | 7/2012 | Watanabe | .............. | G11C 15/04 365/49.17 |
| 2012/0275212 A1 * | 11/2012 | Jung | ........................ | G11C 7/06 365/148 |
| 2013/0010524 A1 * | 1/2013 | Porter | ............... | G11C 13/0004 365/148 |
| 2013/0241515 A1 * | 9/2013 | Yamashiro | .............. | G05F 1/625 323/284 |
| 2014/0078831 A1 * | 3/2014 | Mietus | ................... | G11C 16/06 365/185.21 |
| 2014/0203865 A1 * | 7/2014 | Lee | .......................... | G05F 3/24 327/537 |

FOREIGN PATENT DOCUMENTS

KR    10-2006-0004260 A    1/2006

* cited by examiner

*Primary Examiner* — Michael Tran
(74) *Attorney, Agent, or Firm* — Lee & Morse, P.C.

(57) ABSTRACT

A self bias buffer circuit includes a buffer and bias controller. The buffer provides a self bias voltage based on a reference voltage and to be driven based on the self bias voltage. The buffer also generates an output signal based on a comparison of an input signal and the reference voltage. The bias controller adjusts the self bias voltage based on the reference voltage.

20 Claims, 11 Drawing Sheets

SELF BIAS BUFFER CIRCUIT AND MEMORY DEVICE INCLUDING THE SAME

CROSS-REFERENCE TO RELATED APPLICATION

Korean Patent Application No. 10-2014-0000528, filed on Jan. 3, 2014, and entitled, "Self Bias Buffer Circuit and Memory Device Including the Same," is incorporated by reference herein in its entirety.

BACKGROUND

1. Field

One or more embodiments described herein relate to a self bias buffer circuit and a memory device including the self bias buffer circuit.

2. Description of the Related Art

A buffer is used to temporarily store data for a variety of purposes. One purpose involves compensating for differences in transmission speed when data is transmitted from one device to another device.

One type of buffer outputs a buffered signal after receiving an external signal. The buffered signal may be output by amplifying a voltage difference between the external signal and a reference signal. In this case, a bias voltage may be required to operate the buffer. In some circumstances, it is difficult to provide a proper bias voltage based on operational characteristics of the buffer.

SUMMARY

In accordance with one embodiment, a self bias buffer circuit includes a buffer to provide a self bias voltage based on a reference voltage and to be driven based on the self bias voltage, the buffer to generate an output signal based on a comparison of an input signal and the reference voltage; and a bias controller to boost the self bias voltage based on the reference voltage.

The bias controller may include a boosting transistor to boost the self bias voltage in response to the reference voltage. The boosting transistor may be connected between a power supply voltage and a self bias voltage node, and a gate of the boosting transistor may be coupled to receive the reference voltage.

The bias controller may include a boosting enable transistor connected between the power supply voltage and the boosting transistor, the boosting enable transistor may stop operation of the bias controller in response to an inverted signal of a power enable signal, the boosting transistor and the boosting enable transistor may have opposite conductivity types.

When the reference voltage is greater than a boosting start voltage, the boosting transistor may turn on to increase the self bias voltage as the reference voltage increases. The bias controller may boost the self bias voltage to be symmetrical with respect to the boosting start voltage, when the reference voltage is less than the boosting start voltage and when reference voltage is greater than the boosting start voltage.

An input transistor may be connected between the power supply voltage and the self bias voltage node, and the input transistor may turn on in response to the input signal and boost the self bias voltage.

The bias controller may include an input enable transistor connected between the power supply voltage and the input transistor, wherein the input enable transistor may stop operation of the bias controller in response to the inverted signal of the power enable signal.

The buffer may include a differential circuit to generate the output signal and the self bias voltage based on the reference signal and the input signal; and a bias circuit to drive the differential circuit based on the self bias voltage. The differential circuit may include a reference circuit and an input-output circuit, and the self bias voltage may be provided through a self bias voltage node of the reference circuit.

The reference circuit may include a reference transistor circuit connected between a first node and a second node, wherein the reference transistor circuit may output the self bias voltage through the self bias voltage node based on the reference voltage coupled to gates of the reference transistor circuit, and wherein the self bias voltage node may be output node of the reference circuit.

The input-output circuit may include an input-output transistor circuit connected between the first node and the second node, wherein the input-output transistor circuit may provide the output signal through an output node of the input-output circuit based on the input signal coupled to gates of the input-output transistor circuit.

The bias circuit may include a power supply to provide a power supply voltage to the differential circuit and a ground circuit providing a ground voltage to the differential circuit. The power supply may include a power enable transistor connected between the power supply voltage and a power enable node, the power enable transistor to stop the power supply voltage in response to an inverted signal of a power enable signal; and a power transistor connected between the power enable node and the second node, the power transistor to be driven based on the self bias voltage.

The ground circuit may include a ground enable transistor connected between the ground voltage and a ground enable node, the ground enable transistor to block a conduction path to the ground voltage in response to an inverted signal of a ground enable signal; and a ground transistor connected between the ground enable node and the first node, the ground transistor to be driven based on the self bias voltage.

In accordance with another embodiment, a memory device includes a memory core to store data or to output the stored data in response to one or more control signals; a self bias buffer circuit to receive the data of the memory core or to transmit outside data to the memory core in response to the control signals; and a controller configured to control the memory core and the self bias buffer circuit by generating the one or more control signals. The self bias buffer circuit includes a buffer to provide a self bias voltage based on a reference voltage and to be driven based on the self bias voltage, the buffer to generate an output signal based on a comparison of an input signal and the reference voltage; and a bias controller to boost the self bias voltage based on the reference voltage.

In accordance with another embodiment, an apparatus includes a buffer to generate a bias voltage based on a reference voltage, and to generate an output signal based on a comparison of the reference voltage and input voltage; and a bias circuit to adjust the bias voltage based on the reference voltage, wherein reference voltage is set to a value based on a predetermined width of a data fetch window, and wherein the predetermined width corresponds to a target operational speed of a memory device which includes or is coupled to the buffer.

The bias circuit may adjust the bias voltage to change a width of the data fetch window to the predetermined width. The predetermined width of the data fetch window may correspond to a desired margin of a set-up time or a hold time for a data latch operation. The bias circuit may adjust the bias voltage to cause the buffer to operate in a substantially symmetrical manner relative to the reference voltage. The buffer may include a first differential circuit to generate an initial value of the bias voltage based on the reference voltage, and a second different circuit to generate the output signal based on a comparison of the reference voltage and the input voltage, wherein the first differential circuit is coupled to the second differential circuit.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
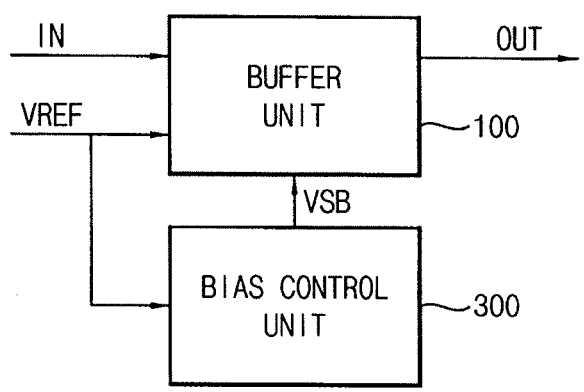
FIG. 1 illustrates an embodiment of a self bias buffer.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Also, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

FIG. 1 illustrates an embodiment of a self bias buffer 10 which includes a buffer unit 100 and a bias control unit 300. The buffer unit 100 provides a self bias voltage VSB based on a reference voltage VREF. The buffer unit 100 is driven based on the self bias voltage VSB and generates an output signal OUT by comparing an input signal IN with the reference voltage VREF.

The bias control unit 300 boosts the self bias voltage VSB based on the reference voltage VREF. For example, the buffer unit 100 may generate the output signal OUT by amplifying a voltage difference between the reference voltage VREF and the input signal IN received from an external source.

Figure 2:
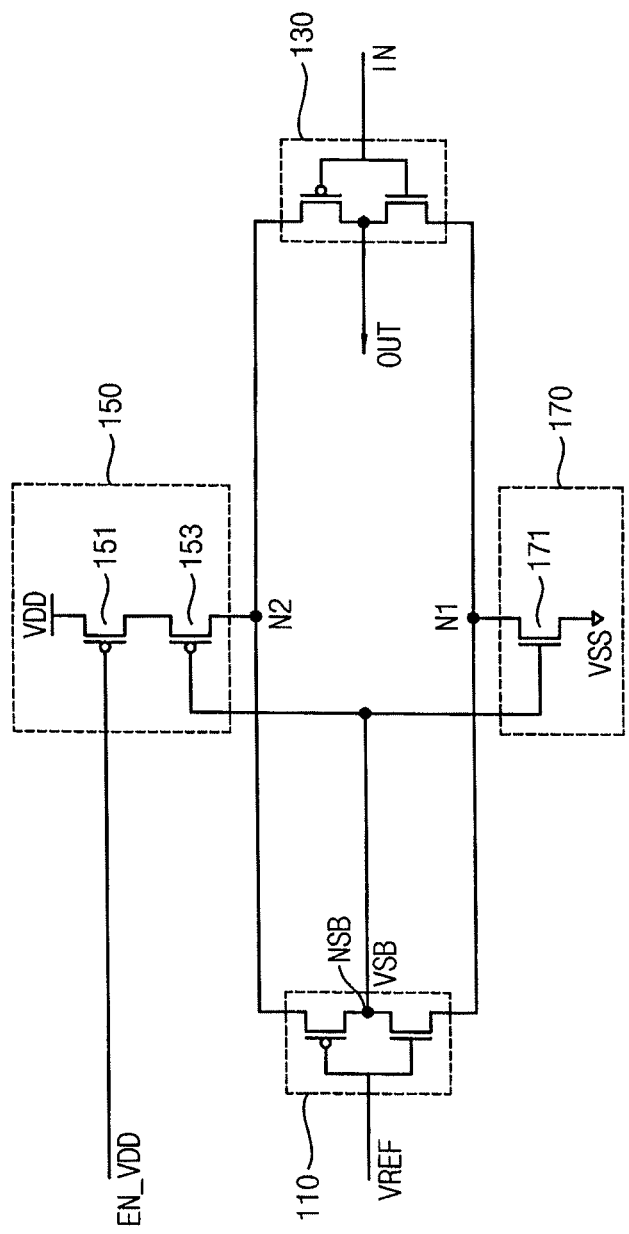
FIG. 2 illustrates an example of a self bias buffer circuit.
Figure 3:
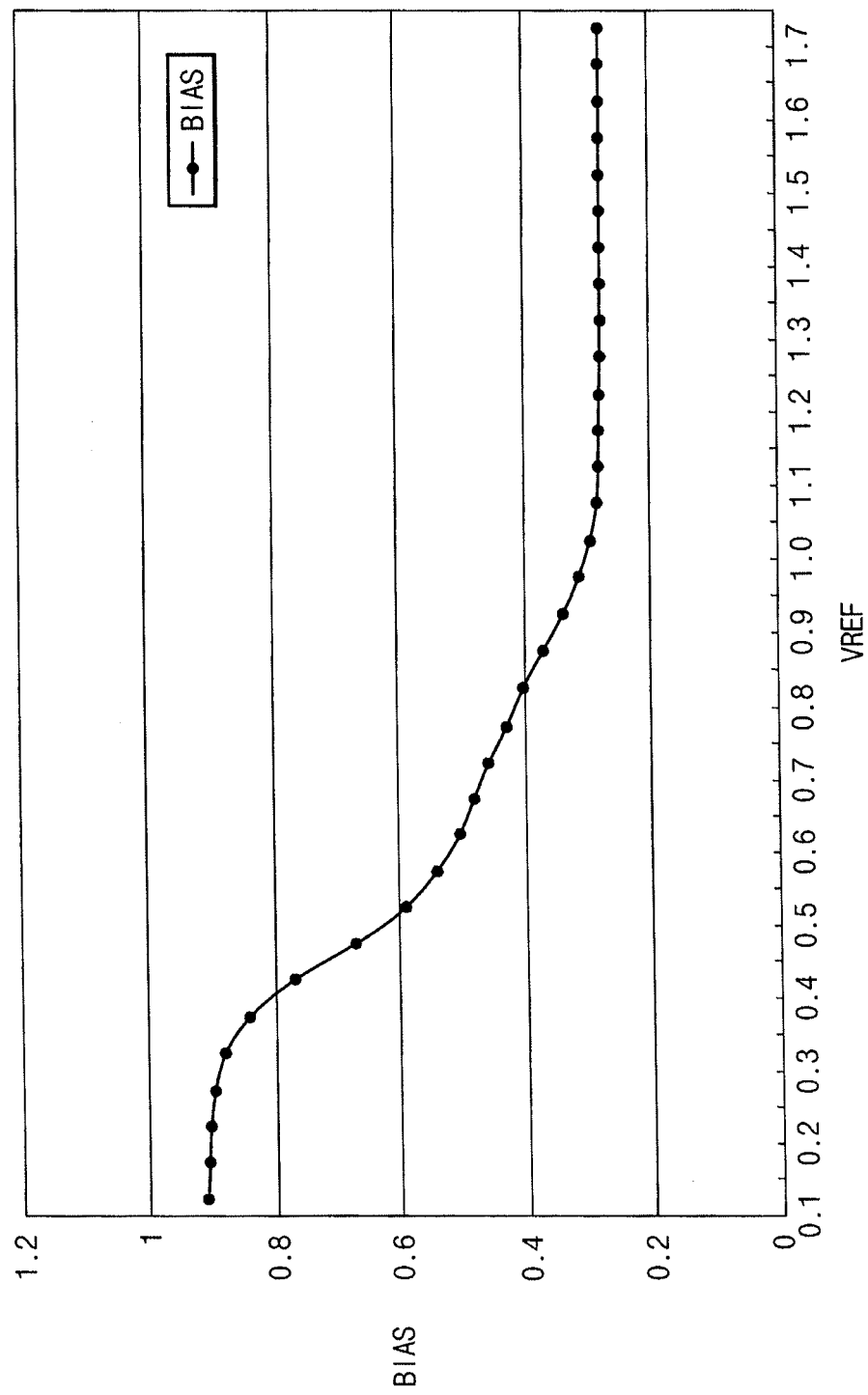
FIG. 3 illustrates an example of a self bias voltage for the self bias buffer circuit.

FIG. 2 illustrates an example of a self bias buffer circuit 20, and FIG. 3 illustrates a self bias voltage based on the reference voltage VREF received by the self bias buffer circuit 20 of FIG. 2.

Referring to FIGS. 2 and 3, when the reference voltage VREF is input into the self bias buffer circuit 20, the reference voltage VREF is transferred to a differential unit 110 and 130 in the self bias buffer circuit 20. The differential unit 110 and 130 includes a reference unit 110 and an input-output unit 130. The reference voltage VREF is provided to the reference unit 110.

The reference unit 110 may be implemented, for example, using a reference CMOS transistor circuit. The reference voltage VREF input into the reference unit 110 may be applied to gates of the reference CMOS transistor circuit. An output of the reference unit 110 may be transferred to a unit 150 and 170 through a self bias voltage node NSB. The output of the reference unit 110 is the self bias voltage VSB.

When a signal having a high logical value (e.g., a high voltage) is applied to the gates of the reference CMOS transistor circuit, a PMOS transistor of the reference CMOS transistor circuit may turn off and an NMOS transistor of the reference CMOS transistor circuit may turn on. In this case, the self bias voltage node NSB of the reference CMOS transistor circuit may have a low logical value, e.g., a low voltage. When a signal having a low logical value (e.g., low voltage) is applied to the gates of the reference CMOS transistor circuit, the PMOS transistor in the reference CMOS transistor circuit may turn on and the NMOS transistor in the reference CMOS transistor circuit may turn off. In this case, the self bias voltage node NSB of the reference CMOS transistor circuit may have a high logical value. As a result, an output signal OUT of the reference unit 110 may be an inverted signal of the input signal IN of the reference unit 110.

As the reference voltage VREF input into the reference unit 110 increases, the NMOS transistor in the reference CMOS transistor circuit may be gradually turned on and the PMOS transistor in the reference CMOS transistor circuit may be gradually turned off. For example, as the reference voltage VREF input into the reference unit 110 increases, a turn-on resistance of the NMOS transistor in the reference CMOS transistor circuit may gradually decrease, and a turn-on resistance of the PMOS transistor in the reference CMOS transistor circuit may gradually increase. Referring to FIG. 3, as the reference voltage VREF input into the reference unit 110 increases, the self bias voltage VSB output to the self bias voltage node NSB of the reference CMOS transistor circuit may decrease.

Figure 4:
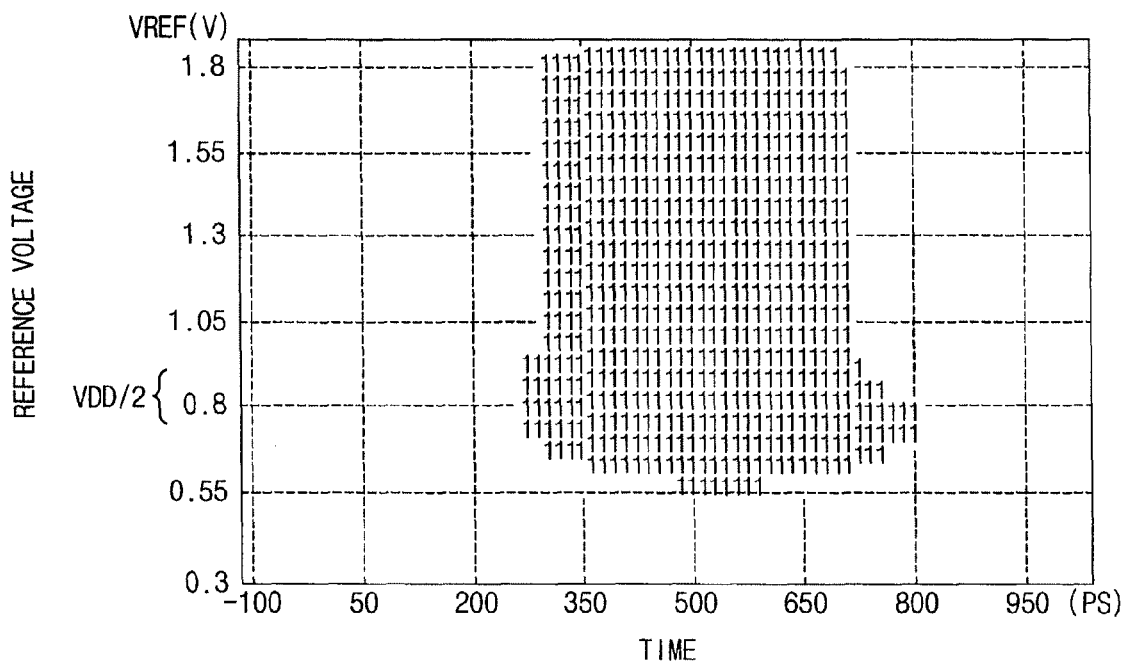
FIG. 4 illustrates an example of a test result of the self bias buffer circuit.

FIG. 4 illustrates an example of a test result of the self bias buffer circuit of FIG. 2 based on a reference voltage VREF. Referring to FIGS. 2 and 4, in order to test the self bias buffer circuit 20, the reference voltage VREF may be determined. Then, an output of the self bias buffer circuit 20 may be tested by moving data according to the time axis.

When the input signal IN of the self bias buffer circuit 20 has a logical high voltage, the self bias buffer circuit 20 may operate normally if the output signal OUT of the self bias buffer circuit 20 has a logical low voltage. When the input signal IN of the self bias buffer circuit 20 has a logical low voltage, the self bias buffer circuit 20 may operate normally if the output signal OUT of the self bias buffer circuit 20 has a logical high voltage.

Next, if the above process is repeated for a changed value of the reference voltage VREF, a result may be obtained as illustrated in FIG. 4. The symbol '1' in FIG. 4 may be used to indicate when the self bias buffer circuit 20 operates normally. Omission of symbol '1' in FIG. 4 may indicate when the self bias buffer circuit 20 operates abnormally.

A memory device may be an example of a system which uses the self bias buffer circuit 20. When the self bias buffer circuit is used in a memory device, the memory device may perform in a training mode and a normal mode.

In the training mode, the reference voltage VREF used in the self bias buffer circuit may be selected. In the normal mode, the output signal OUT may be provided using the input signal IN and the reference voltage VREF selected in the training mode.

Also, in the training mode, a process of selecting the reference voltage VREF may be performed as follows. First, a memory controller may determine a range of the reference voltage VREF in which the memory device operates normally. Then, a predetermined (e.g., center) value of the range of the reference voltage VREF may be selected as the reference voltage VREF. The memory controller may be coupled to the self bias buffer circuit.

For example, as illustrated in FIG. 4, the range of the reference voltage VREF may be from 0.5V to 1.8V. Because the symbol '1' may be presented from 0.5V to 1.8V in FIG. 4, the self bias buffer circuit 20 is considered to operate normally from 0.5V to 1.8V. Therefore, the memory controller may select the reference voltage VREF between 0.5V and 1.8V. In this case, the memory controller may select 1.15V as the reference voltage VREF that is the center value between 0.5V and 1.8V. In other embodiments, the memory controller may select another, or any other, predetermined value in this range as the reference voltage VREF.

When the memory controller selects the reference voltage VREF in the training mode, to select reference voltage VREF with a wider data fetch window may be better for some applications. For example, for these applications, a wider data fetch window may allow for an increase in the margin of a set-up time and a hold time for data latch. As a result, the operational speed of the memory device may be increased, e.g., a target operational speed of the memory device may be achieved. The target operational speed may be a specific speed for an intended application or merely an increased or decreased speed.

For example, the self bias buffer circuit 20 may operate normally when the reference voltage VREF lies in the range from 0.5V to 1.8V, as shown in FIG. 4. When the self bias circuit 20 uses 0.8 V as the reference voltage, the self bias circuit 20 may operate normally from an earlier time to a later time than when the self bias circuit 20 uses a reference voltage VREF over 1.0V. Thus, the self bias circuit 20 may have a wider data fetch window when using a reference voltage VREF of 0.8V than when a reference voltage VREF of over 1.0V is used.

In this case, the data fetch window may be a time interval corresponding to the symbol '1' in FIG. 4 according to the time axis for each reference voltage VREF. The data fetch window for a reference voltage VREF of 0.8V may be wider than the data fetch window for a reference voltage VREF of over 1V. If the data fetch window is wider, the margin of the set-up time and the hold time for data latch may be increased for at least some applications. As a result, the operational speed of the memory device may be increased.

As a result, when the reference voltage VREF is about 0.8V, the data fetch window may be widest. When the reference voltage VREF is about 0.8V, the operational speed of the memory device may be the fastest. However, if the memory controller selects the reference voltage VREF as the center value 1.15V in the range of between 0.8V and 1.8V, the operational speed of the memory device may be decreased from a maximum, or fastest, value.

While a wider data fetch window may be suitable for some applications, a different window size may be used in an another embodiment. Also, a reference voltage VREF may be used which produces a window size smaller than its widest possible size, for example, in order to achieve an operational speed of the memory device that lies in a predetermined range which does not necessarily include the fastest possible speed.

Referring to FIGS. 2 to 4, in case the reference voltage VREF VDD/2-X is applied to the input of the reference unit 110, as the value of X is increased, the reference voltage VREF may be decreased and the self bias voltage VSB may be increased as previously indicated with reference to FIG. 3. The self bias voltage VSB may be used to operate a power supply unit 150 and a ground unit 170. As the self bias voltage VSB is increased, the ground unit 170 may maintain operation and the power supply unit 150 may stop operation.

When the ground unit 170 maintains operation, a ground voltage VSS may be transferred to the input-output unit 130 through the ground unit 170. When the ground unit 170 stops operation, the ground voltage VSS may not be transferred because a conduction path from the ground unit 170 to the input-output unit 130 is blocked.

When the power supply unit 150 maintains operation, a power supply voltage VDD may be transferred to the input-output unit 130 through the power supply unit 150. When the power supply unit 150 stops operation, the power supply voltage VDD may not be transferred because a conduction path from the power supply unit 150 to the input-output unit 130 is blocked.

The ground unit 170 may include a ground NMOS transistor 171 or another type of circuit that operates as a switch. The ground NMOS transistor 171 may be connected between the ground voltage VSS and a first node N1. When the self bias voltage VSB applied to a gate of the ground NMOS transistor 171 is greater than a threshold voltage of the ground NMOS transistor 171, the ground unit 170 may operate normally. Therefore, as the value of X is increased, the self bias voltage VSB may be increased and the self bias voltage VSB may be greater than the threshold voltage to operate the ground unit 170.

The power supply unit 150 may include a power PMOS transistor 153. The power PMOS transistor 153 may be connected between the power supply voltage VDD and a second node N2. When the self bias voltage VSB applied to a gate of the power PMOS transistor 153 is less than a threshold voltage of the power PMOS transistor 153, the power supply unit 150 may operate normally. Therefore, as the value of X is increased, the self bias voltage VSB may be increased and the self bias voltage VSB may be greater than the threshold voltage of the power PMOS transistor 153. If the self bias voltage VSB is greater than the threshold voltage of the power PMOS transistor 153, the power supply unit 150 may stop operation.

When the self bias voltage VSB is greater than the threshold voltage of the power PMOS transistor 153, the ground unit 170 may maintain operation and the power supply unit 150 may stop operation. If the ground unit 170 or the power supply unit 150 stops operation, the self bias buffer circuit 20 may not generate the output signal OUT.

The data fetch window may be narrower based on the reference voltage VREF VDD/2 as the reference voltage VREF is decreased. When the reference voltage VREF is about 0.5V in the aforementioned example, the power supply unit 150 stops operation and the self bias buffer circuit 20 may not generate the output signal OUT. Therefore, when the reference voltage VREF is less than 0.5V, the symbol '1' is not shown in FIG. 4.

Next, when the reference voltage VREF VDD/2+X is applied to the input of the reference unit 110, as the value of X is increased, the reference voltage VREF may be increased and the self bias voltage VSB may be decreased as previously described with reference to FIG. 3. However, when the reference voltage VREF is greater than a certain voltage, the self bias voltage VSB may not be decreased any more.

When the reference voltage VREF is greater than 1.1V, even though the reference voltage VREF is increased, the self bias voltage VSB may maintain about 0.3V. The self bias voltage VSB may be used to operate the power supply unit 150 and the ground unit 170. Even though the self bias voltage VSB is decreased to about 0.3V, the ground unit 170 and the power supply unit 150 may maintain operation.

When the self bias voltage VSB applied to the gate of the ground NMOS transistor 171 is greater than the threshold voltage of the ground NMOS transistor 171, the ground unit 170 may operate normally. As the value of X is increased, the reference voltage VREF may be increased and the self bias voltage VSB may be decreased. The self bias voltage VSB may not become sufficiently lower voltage than the threshold voltage of ground NMOS transistor 171. Therefore, even though the value of X is increased, the ground NMOS transistor 171 may not be turned-off.

When the self bias voltage VSB applied to the gate of the power PMOS transistor 153 is less than the threshold voltage of the power PMOS transistor 153, the power supply unit 150 may operate normally. As the value of X is increased, the self bias voltage VSB may be decreased. If the self bias voltage VSB is decreased, the self bias voltage VSB may become sufficiently lower voltage than the threshold voltage to operate the power supply unit 150.

Because the self bias voltage VSB does not fall below the certain voltage, the ground unit 170 and the power supply unit 150 may maintain operation.

The data fetch window may be not narrower based on the reference voltage VREF VDD/2 as the reference voltage VREF is increased as described in FIG. 4. In this case, the ground unit 170 and power supply unit 150 may be operated by the self bias voltage VSB. Therefore, in case the reference voltage VREF is greater than VDD/2, the symbol '1' is shown as FIG. 4.

When the memory device performs the training mode, the memory controller may not select VDD/2 as the reference voltage VREF. This is because the self bias buffer circuit 20 is not symmetrically operated based on the reference voltage VREF of VDD/2.

When the reference voltage VREF is less than VDD/2, the power supply unit 150 may stop operation and the ground unit 170 may maintain operation. When the reference voltage VREF is greater than VDD/2, the power supply unit 150 and the ground unit 170 may not stop operation. Because the self bias buffer circuit 20 is not symmetrically operated based on VDD/2, the memory controller may not select the reference voltage VREF corresponding to the widest data window. As a result, the operational speed of the memory device may be decreased.

In one embodiment, the self bias buffer circuit 10 may be implemented to symmetrically operate based on the reference voltage VREF VDD/2 using the bias control unit 300. When the self bias buffer circuit 10 is implemented to symmetrically operate based on the reference voltage VREF VDD/2, the memory controller may select VDD/2 as the reference voltage VREF. When the memory controller selects VDD/2 as the reference voltage VREF, the data fetch window may be the widest. As the data fetch widow increases in width, the margin of the set-up time and the hold time for data latch may increase. As a result, the operational speed of the memory device may increase.

Figure 5:
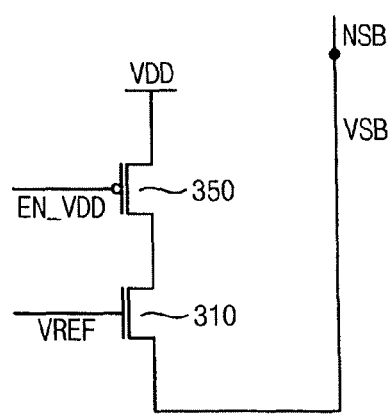
FIG. 5 illustrates an embodiment of a bias control unit.

FIG. 5 illustrates an embodiment of the bias control unit 300 in the self bias buffer circuit 10 of FIG. 1. Referring to FIG. 5, the bias control unit 300 may include a boosting transistor to be turned-on in response to the reference voltage VREF and to boost the self bias voltage VSB. As the reference voltage VREF is increased, the self bias voltage VSB may be decreased. In this case, the self bias buffer circuit 10 may not operate symmetrically based on VDD/2. Therefore, a circuit may be added so that the self bias circuit operates symmetrically based on VDD/2 or another predetermined reference voltage.

Various methods may be used to operate the self bias circuit 10 symmetrically. The self bias buffer circuit 10 may control the self bias voltage VSB to cause the self bias circuit to operate symmetrically. In accordance with one method, the self bias voltage VSB may control the self bias voltage VSB by transferring the power supply voltage VDD to the self bias voltage node NSB through a transistor.

For example, in one embodiment, the boosting transistor may correspond to a boosting NMOS transistor 310 connected between a power supply voltage VDD and a self bias voltage node NSB. The reference voltage VREF is applied to a gate of the boosting NMOS transistor 310. When the boosting NMOS transistor 310 is turned-on, the self bias voltage VSB may be boosted by transferring the power supply voltage VDD to the self bias voltage node NSB.

The boosting NMOS transistor 310 may be operated by the reference voltage VREF, which is applied to the gate of the boosting NMOS transistor 310. When the reference voltage VREF is greater than the threshold voltage of the boosting NMOS transistor 310, the boosting NMOS transistor 310 may gradually turn on and the self bias voltage VSB may be boosted.

As the reference voltage VREF increases, the self bias voltage VSB decreases. When the self bias voltage VSB is controlled so that the self bias buffer circuit 10 operates symmetrically, the reference voltage VREF may boost the self bias voltage VSB over a certain voltage (boosting start voltage). In this case, the self bias buffer circuit 10 may symmetrically operate with respect to the boosting start voltage.

Referring to FIGS. 1 to 3 and 5, when the reference voltage VREF VDD/2-X is applied to the input of the reference unit 110, the reference voltage VREF may be decreased and the self bias voltage VSB may be increased as the value of X is increased, as indicated with reference to FIG. 3. The self bias voltage VSB may be used to operate a power supply unit 150 and a ground unit 170. As the self bias voltage VSB is increased, the ground unit 170 may maintain operation and the power supply unit 150 may stop operation.

Next, when the reference voltage VREF VDD/2+X is applied to the input of the reference unit 110, as the value of X is increased, the reference voltage VREF may be increased. When the self bias buffer circuit 10 is used and the reference voltage VREF is greater than VDD/2, the self bias voltage VSB may be increased. As the self bias voltage VSB is increased, the ground unit 170 may maintain operation and the power supply unit 150 may stop operation.

As a result, when the self bias buffer circuit 10 is implemented to operate symmetrically with respect to the boosting start voltage, the memory controller may select VDD/2 as the reference voltage VREF. When the memory controller selects VDD/2 as the reference voltage VREF, the data fetch window may have a maximum width. When the data fetch widow is wider, the margin of the set-up time and the hold time for data latch may increase. As a result, the operational speed of the memory device may increase.

In one embodiment, the bias control unit 300 may further include a boosting enable PMOS transistor 350 connected between the power supply voltage VDD and the boosting NMOS transistor 310. The boosting enable PMOS transistor 350 may stop operation of the bias control unit 300 in response to an inverted signal of a power enable signal EN_VDD.

In bias control unit 300, operation of the self bias buffer circuit 10 may be stopped by coupling the boosting enable PMOS transistor 350 between the power supply voltage VDD and the boosting NMOS transistor 310.

When the boosting enable PMOS transistor 350 is included, the boosting enable PMOS transistor 350 may stop operation of the bias control unit 300 in response to an inverted signal of the power enable signal EN_VDD.

In one embodiment, when the reference voltage VREF is greater than a boosting start voltage, the boosting NMOS transistor 310 may turn on as the reference voltage VREF is increased to boost the self bias voltage VSB.

When the reference voltage VREF is greater than the boosting start voltage, the boosting NMOS transistor 310 may be gradually turned-on. When the boosting NMOS transistor 310 is gradually turned-on, the self bias voltage VSB may be boosted by transferring the power supply voltage VDD connected a drain of the boosting NMOS transistor 310 to a source of the boosting NMOS transistor 310.

In one embodiment, the bias control unit 300 may boost the self bias voltage VSB so that the self bias voltage VSB, in case the reference voltage VREF is less than the boosting start voltage, and the self bias voltage VSB, in case the reference voltage VREF is greater than the boosting start voltage, are symmetrically formed with respect to the boosting start voltage. As a result, the self bias buffer circuit 10 may operate symmetrically with respect to the boosting start voltage.

When the reference voltage VREF VDD/2-X is applied to the input of the reference unit 110, the reference voltage VREF may be decreased and the self bias voltage VSB may be increased as the value of X is increased. The self bias voltage VSB may be used to operate the power supply unit 150 and the ground unit 170. As the self bias voltage VSB is increased, the ground unit 170 may maintain operation and the power supply unit 150 may stop operation.

When the reference voltage VREF VDD/2+X is applied to the input of the reference unit 110, the reference voltage VREF may be increased as the value of X is increased. When the self bias buffer circuit 10 is used and the reference voltage VREF is greater than VDD/2, the self bias voltage VSB may be increased. Therefore, as the self bias voltage VSB is increased, the ground unit 170 may maintain operation and the power supply unit 150 may stop operation.

When the self bias buffer circuit 10 is implemented to operate symmetrically with respect to the boosting start voltage, the memory controller may select VDD/2 as the reference voltage VREF. When the memory controller selects VDD/2 as the reference voltage VREF, the data fetch window may achieve a wider or maximum width. When the data fetch widow has a wider or maximum width, the margin of the set-up time and the hold time for data latch may be increased. As a result, the operational speed of the memory device may be increased.

Figure 6:
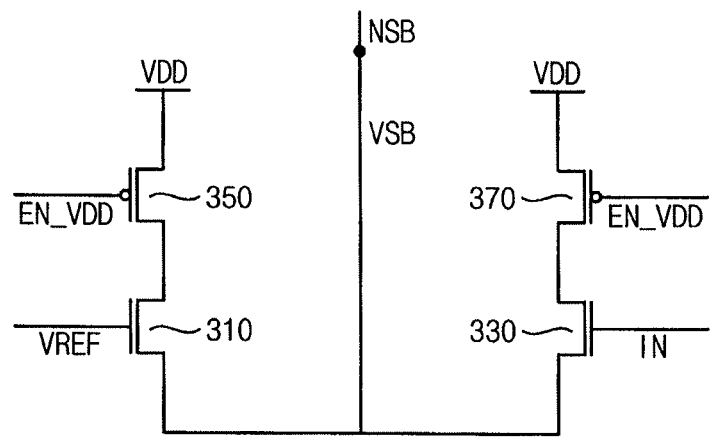
FIG. 6 illustrates another embodiment of a bias control unit.

FIG. 6 illustrates another embodiment of the bias control unit 300 in the self bias buffer circuit 10 of FIG. 1. Referring to FIG. 6, the bias control unit 300 includes an input NMOS transistor 330 connected between the power supply voltage VDD and the self bias voltage node NSB. The input NMOS transistor 330 is turned-on in response to the input signal IN to boost the self bias voltage VSB.

The input NMOS transistor 330 may be connected between the power supply voltage VDD and the self bias voltage node NSB as a differential pair of the boosting NMOS transistor 310. When the input NMOS transistor 330 is turned-on, the self bias voltage VSB may be boosted by transferring the power supply voltage VDD to the self bias voltage node NSB.

The input NMOS transistor 330 may be operated by the input signal IN, which is applied to a gate of the input NMOS transistor 330. When the input signal IN is greater than the threshold voltage of the input NMOS transistor 330, the input NMOS transistor 330 may be turned-on and the self bias voltage VSB may be boosted.

In one embodiment, the bias control unit 300 may further include an input enable PMOS transistor 370 connected between the power supply voltage VDD and the input NMOS transistor 330. The input enable PMOS transistor 370 may stop operation of the bias control unit 300 in response to the inverted signal of the power enable signal EN_VDD. When the input enable PMOS transistor 370 is used, the input enable PMOS transistor 370 may stop operation of the bias control unit 300 in response to the inverted signal of the power enable signal EN_VDD.

Figure 7:
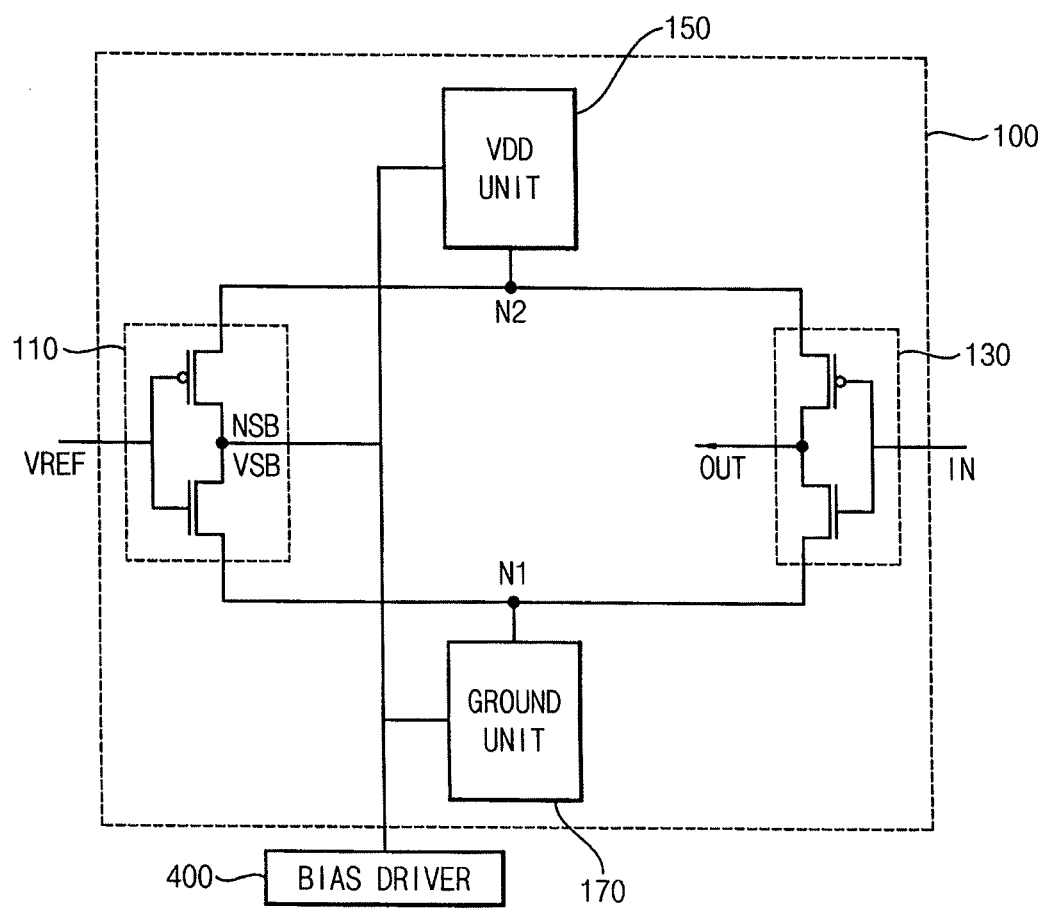
FIG. 7 illustrates an embodiment of a buffer unit.

FIG. 7 illustrates an embodiment of a buffer unit, which, for example, may correspond to the buffer unit 100 in the self bias buffer circuit 10 of FIG. 1. Referring to FIG. 7, the buffer unit 100 may include a differential unit 110 and 130 and a bias unit 150 and 170.

The differential unit 110 and 130 may generate the output signal OUT and the self bias voltage VSB based on the reference signal and the input signal IN. The differential unit 110 and 130 may generate the output signal OUT by amplifying a voltage difference between the reference signal and the input signal IN. The differential unit 110 and 130 may internally generate the self bias voltage VSB based on the reference voltage VREF. In one embodiment, the differential unit 110 and 130 may be similar structure to a differential amplifier. The structure of the differential unit 110 and 130 may be implemented using the CMOS transistor circuit or another circuit.

The bias unit 150 and 170 may operate the differential unit 110 and 130 based on the self bias voltage VSB. When the bias unit 150 and 170 is operated by the self bias voltage VSB, the bias unit 150 and 170 may transfer the power supply voltage VDD or the ground voltage VSS to the differential unit 110 and 130.

In one embodiment, the differential unit 110 and 130 may include a reference unit 110 and an input-output unit 130. The self bias voltage VSB may be provided through a self bias voltage node NSB of the reference unit 110.

The differential unit 110 and 130 may include the reference unit 110 and the input-output unit 130. The reference unit 110 may provide the self bias voltage VSB based on the reference voltage VREF. The input-output unit 130 may generate the output signal OUT by amplifying a voltage difference between the reference signal and the input signal IN.

In one embodiment, the reference unit 110 may include a reference CMOS transistor circuit, which is connected between a first node N1 and a second node N2 and which outputs the self bias voltage VSB through the self bias voltage node NSB. The self bias voltage node NSB may be an output node of the reference unit 110. The self bias voltage VSB may be output through node NSB by applying the reference voltage VREF to gates of the reference CMOS transistor circuit.

The input-output unit 130 may include an input-output CMOS transistor circuit, which is connected between the first node N1 and the second node N2 and which provides the output signal OUT through an output node of the input-output unit 130. The output signal OUT may be provided through the output node by applying the input signal IN to gates of the input-output CMOS transistor circuit.

In one embodiment, the bias unit 150 and 170 may include a power supply unit 150 and a ground unit 170. The power supply unit 150 provides a power supply voltage VDD to the differential unit 110 and 130. The ground unit 170 provides a ground voltage VSS to the differential unit 110 and 130.

When the power supply unit 150 is operated by the self bias voltage VSB, the power supply unit 150 may transfer the power supply voltage VDD to the input-output unit 130. In this case, the output signal OUT of the input-output unit 130 may be a logical high voltage. When the ground unit 170 is operated by the self bias voltage VSB, the ground unit 170 may transfer the ground voltage VSS to the input-output unit 130. In this case, the output signal OUT of the input-output unit 130 may be a logical low voltage.

Figure 8:
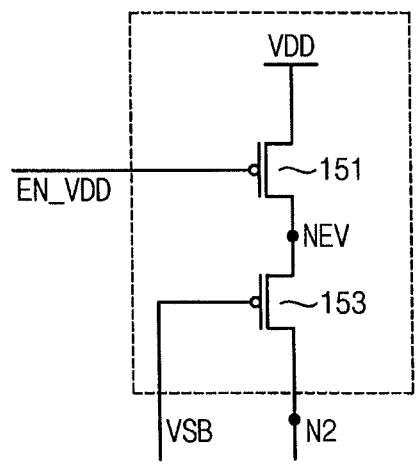
FIG. 8 illustrates an embodiment of a power supply unit for the buffer unit.

FIG. 8 illustrates an embodiment of the power supply unit 150 in the buffer unit 100 of FIG. 7. Referring to FIGS. 7 and 8, the power supply unit 150 may include a power enable PMOS transistor 151 and a power PMOS transistor 153. The power enable PMOS transistor 151 is connected between the power supply voltage VDD and a power enable node NEV. The power enable PMOS transistor 151 may stop the power supply voltage VDD in response to an inverted signal of a power enable signal EN_VDD. The power PMOS transistor 153 is connected between the power enable node NEV and the second node N2, and may be operated based on the self bias voltage VSB.

A circuit may be added to stop operation of the power supply unit 150. When operation of the power supply unit 150 is stopped, operation of the self bias buffer circuit 10 may be stopped. The power enable PMOS transistor 151 may be connected between the power supply voltage VDD and a power enable node NEV.

When the power enable PMOS transistor 151 receives the inverted signal of the power enable signal EN_VDD, the power enable PMOS transistor 151 may be turned-off. When the power enable PMOS transistor 151 is turned-off, the conduction path from the power supply voltage VDD to a source of the power enable PMOS transistor 151 may be blocked and the power supply voltage VDD may not be transferred to the input-output unit 130.

Figure 9:
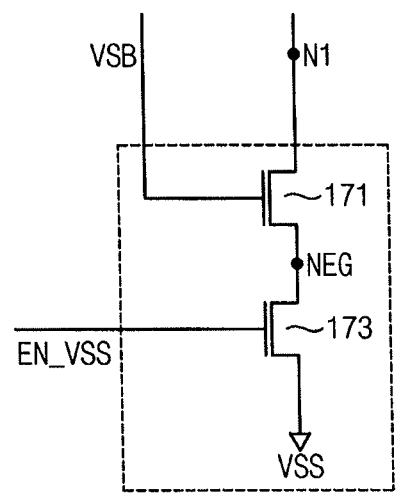
FIG. 9 illustrates an embodiment of a ground unit for the buffer unit.

FIG. 9 illustrates an embodiment of the ground unit 170 in the buffer unit 100 of FIG. 7. Referring to FIGS. 7 and 9, the ground unit 170 may include a ground enable NMOS transistor 173 and a ground NMOS transistor 171. The ground enable NMOS transistor 173 is connected between the ground voltage VSS and a ground enable node NEG, and may block a conduction path in response to an inversion signal of a ground enable signal. The conduction path is coupled to the ground voltage VSS. The ground NMOS transistor 171 is connected between the ground enable node NEG and the first node N1, and may be operated based on the self bias voltage VSB.

A circuit may be added to stop operation of the power supply unit 150. When operation of the power supply unit 150 is stopped, operation of the self bias buffer circuit 10 may be stopped. The power enable PMOS transistor 151 may be connected between the power supply voltage VDD and a power enable node NEV.

A circuit may be added to stop operation of the ground unit 170. When operation of the ground unit 170 is stopped, operation of the self bias buffer circuit 10 may be stopped. The ground enable NMOS transistor 173 may be connected between the ground voltage VSS and a ground enable node NEG.

When the ground enable NMOS transistor 173 receives the inverted signal of the ground enable signal, the ground enable NMOS transistor 173 may be turned-off. When the ground enable NMOS transistor 173 is turned-off, the conduction path from the ground voltage VSS to a drain of the ground enable NMOS transistor 173 may be blocked, and the ground voltage VSS may not transferred to the input-output unit 130.

When the ground unit 170 or the power supply unit 150 stops operation, the conduction path from the power supply unit 150 to the ground unit 170 may be blocked and the self bias buffer circuit 10 may stop operation.

Figure 10:
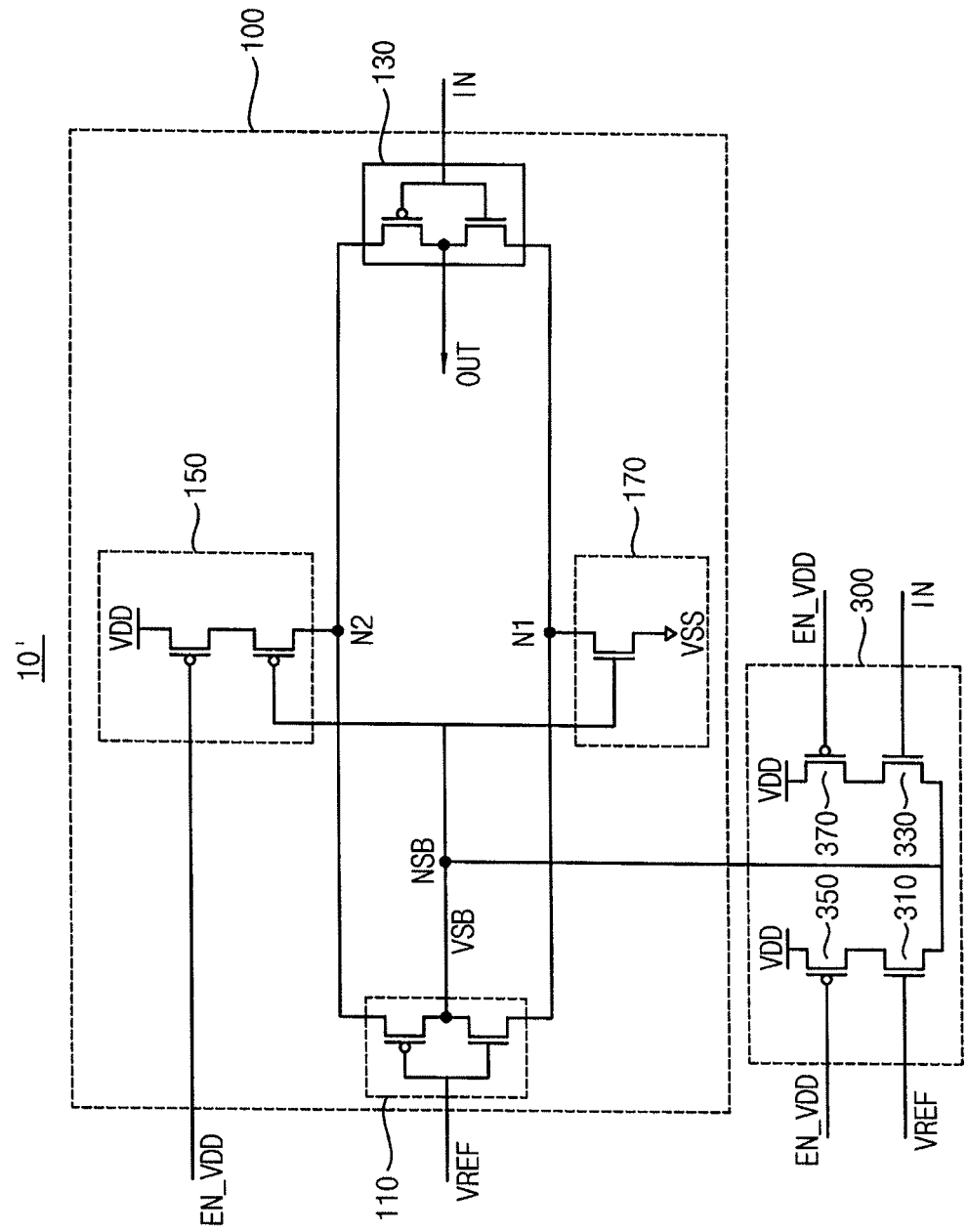
FIG. 10 illustrates another embodiment of a self bias buffer circuit.

FIG. 10 illustrates another embodiment of a self bias buffer circuit 10' which may be implemented to operate symmetrically based on the reference voltage VREF VDD/2 using the bias control unit 300. When the self bias buffer circuit 10' is implemented to operate symmetrically based on the reference voltage VREF VDD/2, the memory controller may select VDD/2 as the reference voltage VREF. When the memory controller selects VDD/2 as the reference voltage VREF, the data fetch window may have a wider or maximum width. When the data fetch widow is wider, the margin of the set-up time and the hold time for data latch may be increased. As a result, the operational speed of the memory device may be increased.

Figure 11:
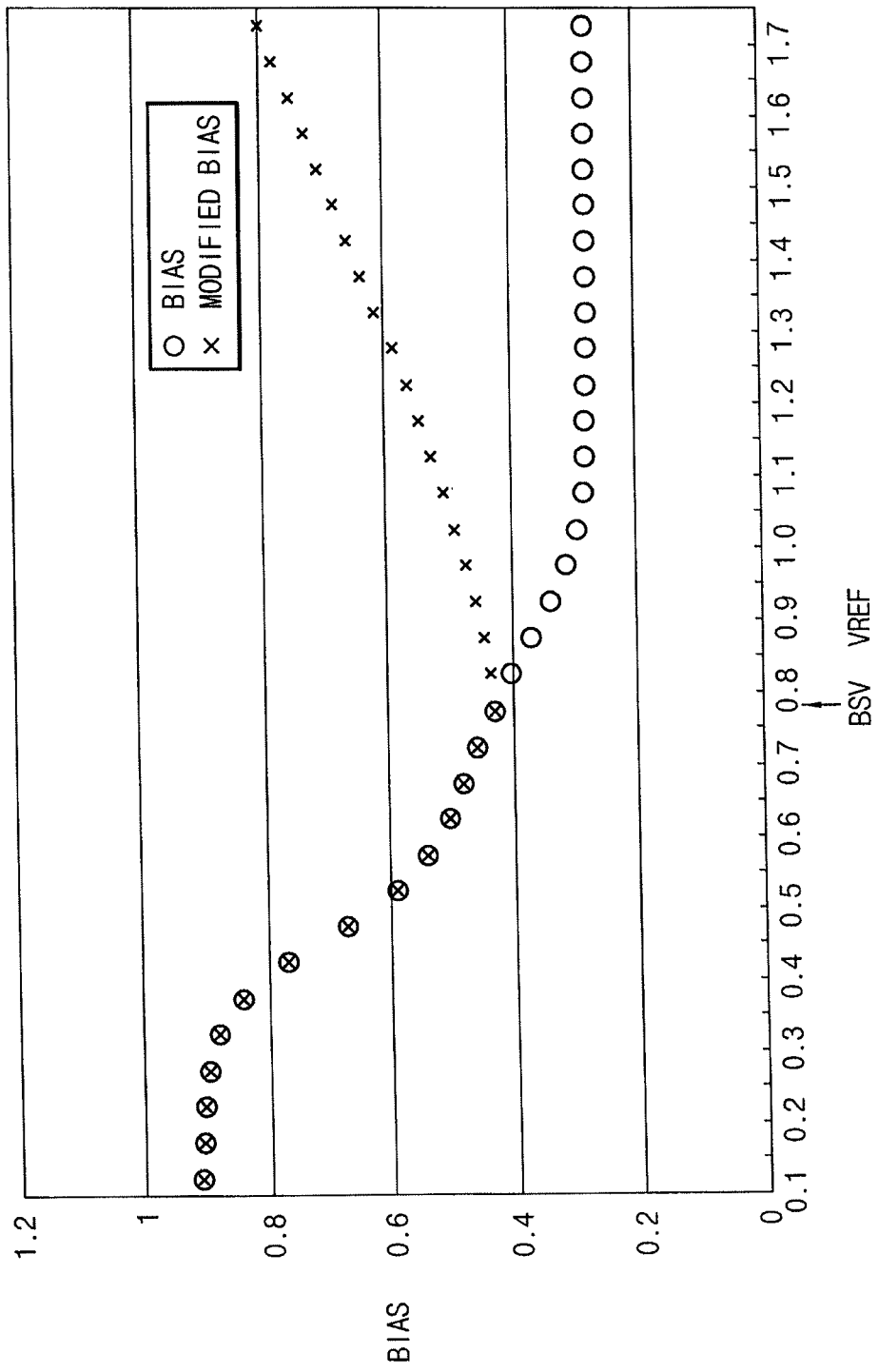
FIG. 11 illustrates a self bias voltage for the self bias buffer circuit in FIG. 10.

FIG. 11 illustrates an example of the self bias voltage for the self bias buffer circuit 10' in FIG. 10 when the bias control unit 300 in the self bias buffer circuit 10' is enabled. As the reference voltage VREF increases, the self bias voltage VSB decreases. However, when the reference voltage VREF is greater than the boosting start voltage, the self bias voltage VSB does not decrease any more. As the reference voltage VREF increases further, the self bias voltage VSB increases.

Referring again to FIG. 2, an example is illustrated where the bias control unit 300 in the self bias buffer circuit 20 is disabled. In this case, when the reference voltage VREF increases, the NMOS transistor in the CMOS transistor circuit is gradually turned-on and the PMOS transistor in the CMOS transistor circuit is gradually turned-off. As a result, the self bias voltage VSB may be decreased.

Referring again to FIG. 5, when the reference voltage VREF is less than the boosting start voltage, the reference voltage VREF is less than the threshold voltage of the boosting NMOS transistor 310. In this case, even though the reference voltage VREF is increased, the boosting NMOS transistor 310 may not be turned on. However, when the reference voltage VREF is greater than the boosting start voltage, the reference voltage VREF is greater than the threshold voltage of the boosting NMOS transistor 310. In this case, as the reference voltage VREF increases, the boosting NMOS transistor 310 is turned on and the self bias voltage VSB may be boosted.

Figure 12:
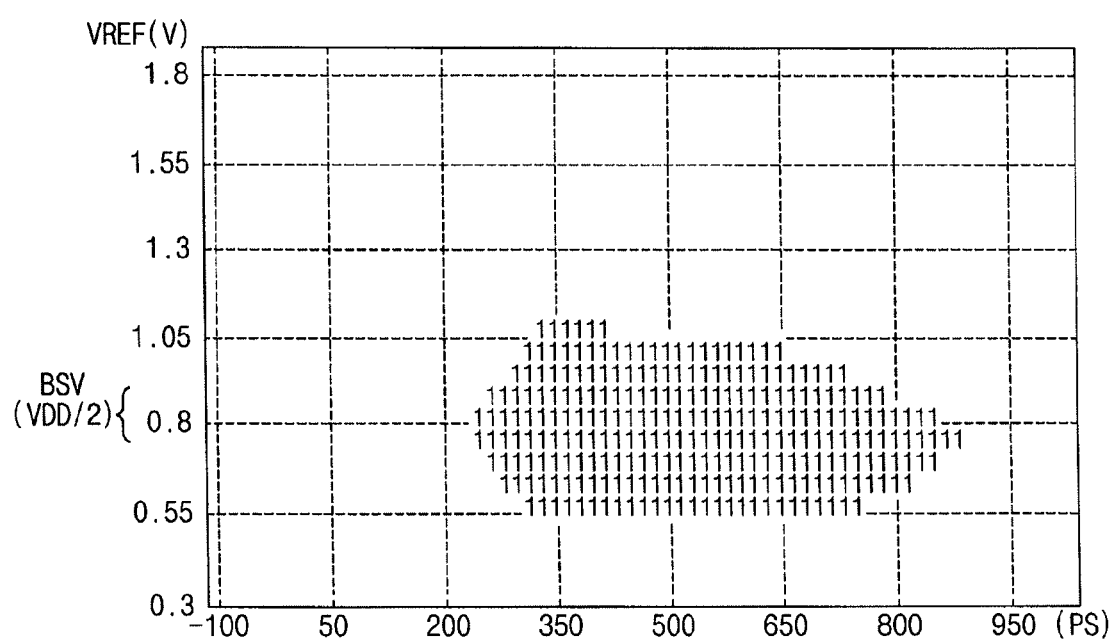
FIG. 12 illustrates a test result for the self bias buffer circuit in FIG. 10.

FIG. 12 illustrates an example of a test result of the self bias buffer circuit 10' in FIG. 10 which operates according to the reference voltage VREF. By comparison, FIG. 2 illustrates an example where the bias control unit 300 in the self bias buffer circuit 20 is disabled. When the self bias buffer circuit 20 of FIG. 2 is used, the self bias buffer circuit 20 may not operate symmetrically based on the reference voltage VREF VDD/2. Therefore the memory controller may not select the reference voltage VREF corresponding to the widest data window. As a result, the operational speed of the memory device may be decreased.

However, referring to FIGS. 10 and 12, an example is illustrated where the bias control unit 300 in the self bias buffer circuit 10 is enabled. When the self bias buffer circuit 10 is enabled, and when the reference voltage VREF is less than the boosting start voltage, even though the reference voltage VREF is increased, the boosting NMOS transistor 310 may not be turned-on. Therefore, the diagrams in FIGS. 4 and 12 may correspond to a same cause in which the reference voltage VREF is less than the boosting start voltage.

When the reference voltage VREF is greater than the boosting start voltage, as the reference voltage VREF increases, the boosting NMOS transistor 310 is gradually turned-on and the self bias voltage VSB is boosted in the self bias buffer circuit 10'. Therefore, the self bias buffer circuit 10' may operate symmetrically based on the reference voltage VREF VDD/2.

In this case, the memory controller may select VDD/2 as the reference voltage VREF. When the memory controller selects VDD/2 as the reference voltage VREF, the width of the data fetch window, e.g., may reach a maximum width. When the width of the data fetch widow increases, the margin of the set-up time and the hold time for data latch may increase. As a result, the operational speed of the memory device may increase.

Figure 13:
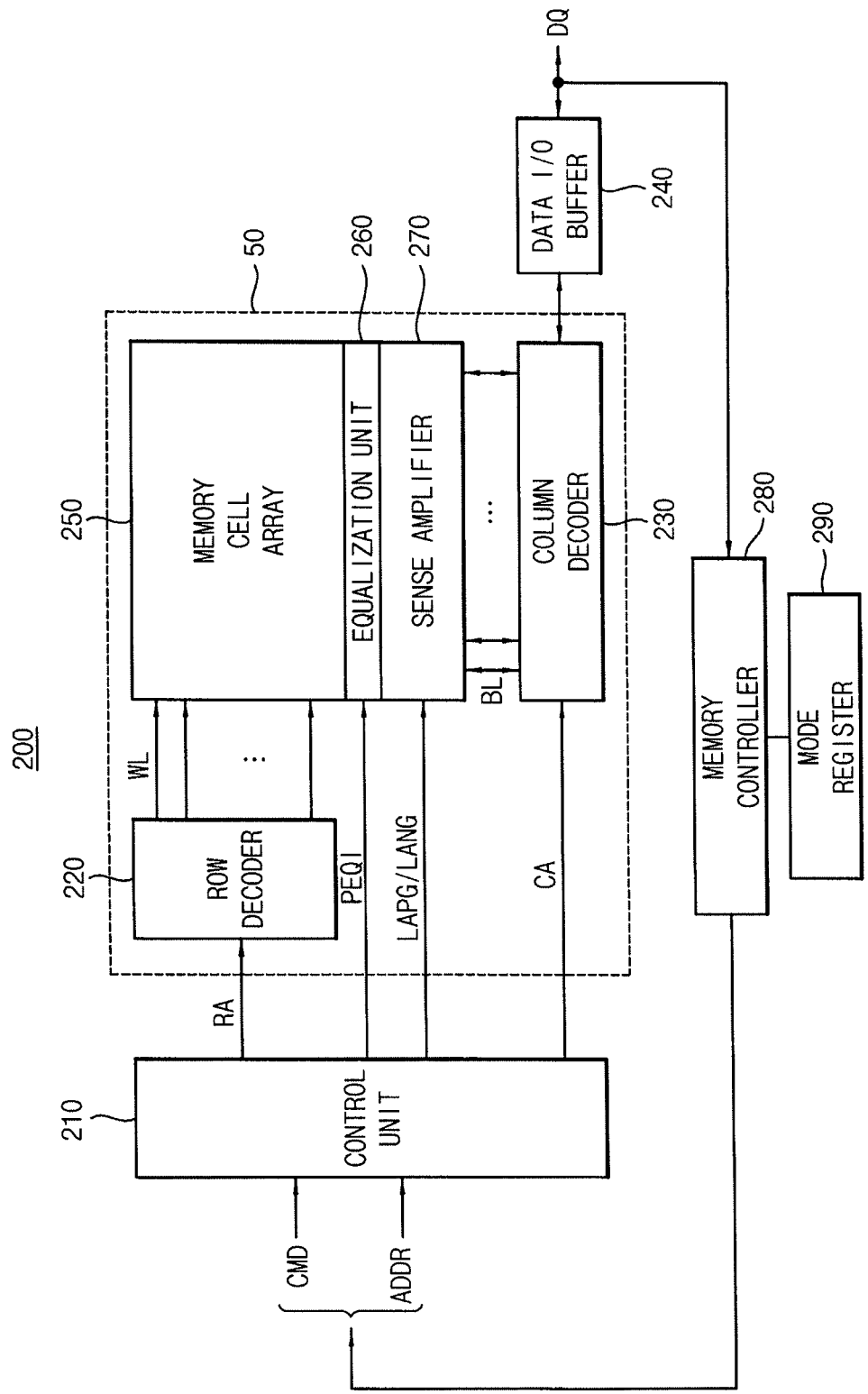
FIG. 13 illustrates an embodiment of a memory device.

FIG. 13 illustrates an embodiment of a memory device 200 which includes a memory core 50, a self bias buffer circuit, and a control unit 210. The self bias buffer circuit may be or be included in a data I/O buffer 240, to be described in greater detail.

The memory core 50 includes a row decoder 220, a column decoder 230, a memory cell array 250, and a sense amplifier 270 connected between the memory cell array 250 and the column decoder 230. The memory core 50 stores data and/or outputs the stored data in response to control signals.

The self bias buffer circuit may correspond to any of the aforementioned embodiments. In operation, the self-bias circuit receives data from the memory core 50 and/or transmits outside data to the memory core 50 in response to the control signals.

The control unit 210 controls the memory core 50 and the self bias buffer circuit by generating the control signals. In one embodiment, the self bias buffer circuit includes a buffer unit 100 and a bias control unit 300 as illustrated in FIG. 1. The buffer unit 100 provides a self bias voltage VSB based on a reference voltage VREF, operates based on the self bias voltage VSB, and generates an output signal OUT by comparing an input signal IN with the reference voltage VREF. The bias control unit 300 boosts the self bias voltage VSB based on the reference voltage VREF.

The control unit 210 controls operations of the memory device 200. For example, the control unit 210 may generate control signals for the memory device 200 to perform a write operation or a read operation. The control unit 210 may include a command decoder that decodes the command signal CMD received from a memory controller 280 and a mode register 290 used to set an operation mode of the memory device 200.

The command decoder may generate the control signals corresponding to the command signal CMD, for example, by decoding a write enable signal (/WE), a row address strobe signal (/RAS), a column address strobe signal (/CAS), a chip select signal (/CS), etc. The control unit 210 may further receive a clock signal (CLK) and a clock enable signal (/CKE) for operating the memory device 200 in a synchronous manner.

The memory cell array 250 includes a plurality of memory cells coupled to a plurality of word lines WL and a plurality of bit lines BL. The memory cell array 250 may include a plurality of memory blocks, and each of the memory blocks may include a plurality of pages. For example, one page may include one row of memory cells coupled to a same word line WL. An equalization unit 260 may precharge the plurality of bit lines BL to the precharge voltage VBL in response to an equalization control signal PEQI.

The sense amplifier 270 amplifies voltages of the plurality of bit lines BL in response to a high bias control signal LAPG or a low bias control signal LANG. For example, the sense amplifier 270 may amplify the voltage of a bit line BL to a supply voltage when the voltage of the bit line BL is higher than the precharge voltage VBL. The sense amplifier 270 amplifies a voltage of a bit line BL to a ground voltage when the voltage of the bit line BL is lower than the precharge voltage VBL.

The row decoder 220 is coupled to the memory cell array 250 through the plurality of word lines WL. The row decoder 220 may decode a row address RA provided from the control unit 210 and select one of the plurality of pages by activating one of the plurality of word lines WL corresponding to the row address RA. For example, the row decoder 220 may apply a word line driving voltage to the word line WL corresponding to the row address RA.

The column decoder 230 may be coupled to the memory cell array 250, the equalization unit 260, and the sense amplification unit 270 through the bit lines BL. The column decoder 230 may decode a column address CA from the control unit 210, select one of the bit lines BL corresponding to the column address CA, and provide data DQ received through the selected bit line BL to a data input/output buffer 240 or provide data DQ received from the data input/output buffer 240 to the selected bit line BL.

The data input/output buffer 240 may transmit data DQ to the memory controller 280 through a data pin or receive data DQ from the memory controller 280 through a data pin.

As previously indicated, the self bias buffer circuit according to any of the aforementioned embodiments may be used as or may be included in the data input/output buffer 240. The self bias buffer circuit may be implemented to operate symmetrically based on the reference voltage VREF VDD/2 using the bias control unit 300. When the self bias buffer circuit 10 operates symmetrically based on the reference voltage VREF VDD/2, the memory controller 280 may select VDD/2 as the reference voltage VREF. When the memory controller 280 selects VDD/2 as the reference voltage VREF, the width of the data fetch window is increased, e.g., has a maximum width. When the width of the data fetch widow increases, the margin of the set-up time and the hold time for data latch increases. As a result, the operational speed of the memory device may increase.

Figure 14:
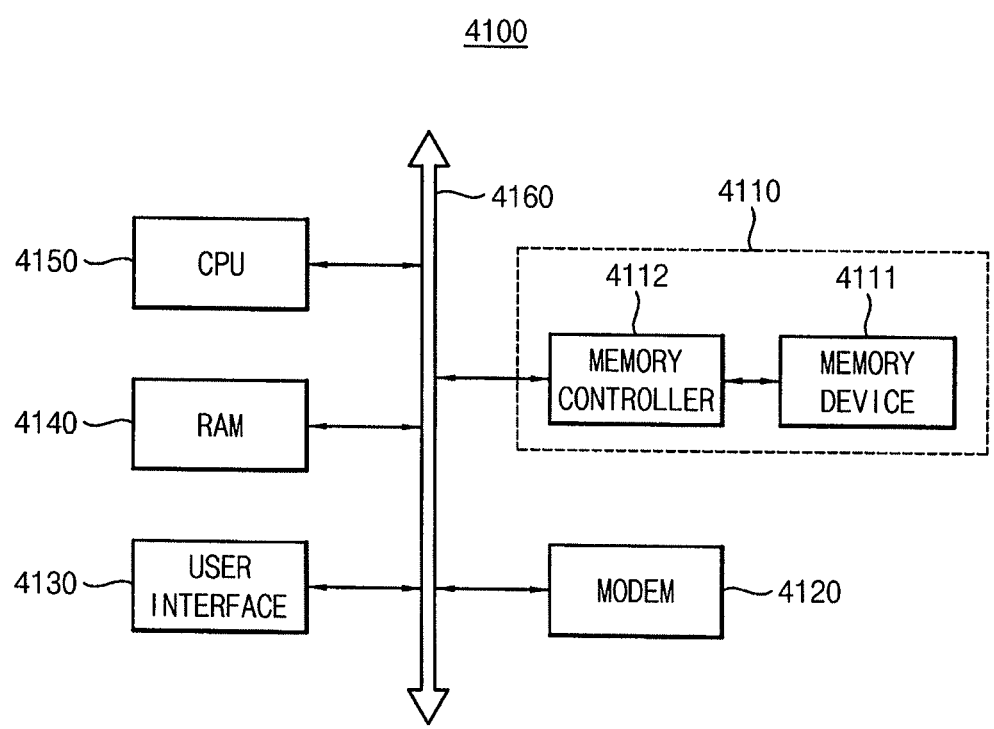
FIG. 14 illustrates an embodiment of a computing system.

FIG. 14 illustrates an embodiment of a computing system 4100 which, for example, may be a mobile device or a desktop computer including a memory device 4111 such as but not limited to the memory device 200 in FIG. 13. The computing system 4100 includes a memory system 4110, a modem 4120, a user interface 4130, a random access memory (RAM) 4140, and a central processing unit (CPU) 4150 which are electrically coupled to a system bus 4160.

The memory system 4110 includes the memory device 4111 and a memory controller 4112. The memory device 4111 may store data processed by the CPU 4150 and/or data provided from external devices. The memory controller 4112 may correspond, for example, to memory controller 280 in FIG. 13.

At least one of the resistive memory device 4111 or the RAM 4140 may be a magnetoresistive RAM (MRAM) device including spin transfer torque (STT) MRAM cells. For example, memory device 4111 may include MRAM cells for storing a large amount of data, and/or the RAM 4140 may include MRAM cells requiring rapid access time for system data. The computing system 4100 may further include other features including but not limited to an application chipset, an image sensor, input-output devices such as a keyboard, a monitor, etc.

By way of summation and review, a self bias buffer circuit according to one or more of the aforementioned embodiments may operate symmetrically based on a reference voltage using the bias control unit. When the self bias buffer circuit is implemented to operate symmetrically based on the reference voltage, a memory controller may select a predetermined voltage as the reference voltage. When the memory controller selects the predetermined voltage as the reference voltage, a size (e.g., a width) of a data fetch window is adjusted. When the width of the data fetch widow is increased, a margin of the set-up time and the hold time for data latch may increase. As a result, the operational speed of the memory device may increase.

In with one or more of the aforementioned embodiments, the width of the data fetch window may decrease, in order to decrease the margin of the set-up time and/or hold time for a data latch operation, and commensurately to decrease the operational speed of the memory. This embodiment may be useful, for example, when the buffer or host device is to operate in a low power mode or other mode where operational speed is not required to be maximized.

In with one or more of the aforementioned embodiments, a self bias buffer circuit increases operational speed and reliability using a proper bias voltage that is based on one or more operational characteristics of a buffer.

In with one or more of the aforementioned embodiments, a memory device increases operational speed and reliability using a proper bias voltage based on one or more operational characteristics of a buffer.

The methods and processes described herein may be performed by code or instructions to be executed by a computer, processor, or controller. Because the algorithms that form the basis of the methods (or operations of the computer, processor, or controller) are described in detail, the code or instructions for implementing the operations of the method embodiments may transform the computer, processor, or controller into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, or controller which is to execute the code or instructions for performing the method embodiments described herein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A self bias buffer circuit, comprising:
   a buffer to provide a self bias voltage based on a reference voltage and to be driven based on the self bias voltage, the buffer to generate an output signal based on a comparison of an input signal and the reference voltage; and
   a bias controller to boost the self bias voltage based on the reference voltage, wherein the bias controller includes a boosting transistor to boost the self bias voltage in response to the reference voltage.

2. The circuit as claimed in claim 1, wherein:
   the boosting transistor is connected between a power supply voltage and a self bias voltage node, and
   a gate of the boosting transistor is coupled to receive the reference voltage.

3. The circuit as claimed in claim 2, wherein the bias controller includes:
   a boosting enable transistor connected between the power supply voltage and the boosting transistor, wherein the boosting enable transistor is to stop operation of the bias controller in response to an inverted signal of a power enable signal, the boosting transistor and the boosting enable transistor having opposite conductivity types.

4. The circuit as claimed in claim 3, wherein:
   when the reference voltage is greater than a boosting start voltage, the boosting transistor is to turn on to increase the self bias voltage as the reference voltage increases.

5. The circuit as claimed in claim 3, wherein the bias controller is to boost the self bias voltage to be symmetrical with respect to the boosting start voltage, when the reference voltage is less than the boosting start voltage or when reference voltage is greater than the boosting start voltage.

6. The circuit as claimed in claim 3, wherein the bias controller includes:
   an input transistor connected between the power supply voltage and the self bias voltage node, wherein the input transistor is to turn on in response to the input signal and boost the self bias voltage.

7. The circuit as claimed in claim 6, wherein the bias controller includes:
   an input enable transistor connected between the power supply voltage and the input transistor, wherein the input enable transistor is to stop operation of the bias controller in response to the inverted signal of the power enable signal.

8. The circuit as claimed in claim 1, wherein the buffer includes:
   a differential circuit to generate the output signal and the self bias voltage based on the reference voltage and the input signal; and
   a bias circuit to drive the differential circuit based on the self bias voltage.

9. The circuit as claimed in claim 8, wherein:
   the differential circuit includes a reference circuit and an input-output circuit, and the self bias voltage is provided through a self bias voltage node of the reference circuit.

10. The circuit as claimed in claim 9, wherein the reference circuit includes:
    a reference transistor circuit connected between a first node and a second node, wherein the reference transistor circuit is to output the self bias voltage through the self bias voltage node based on the reference voltage coupled to gates of the reference transistor circuit, and wherein the self bias voltage node is an output node of the reference circuit, and the input-output circuit that includes an input-output transistor circuit connected between the first node and the second node, wherein the input-output transistor circuit is to provide the output signal through an output node of the input-output circuit based on the input signal coupled to gates of the input-output transistor circuit.

11. The circuit as claimed in claim 10, wherein the bias circuit includes:
a power supply to provide a power supply voltage to the differential circuit and a ground circuit providing a ground voltage to the differential circuit.

12. The circuit as claimed in claim 11, wherein the power supply includes:
a power enable transistor connected between the power supply voltage and a power enable node, the power enable transistor to stop the power supply voltage in response to an inverted signal of a power enable signal; and
a power transistor connected between the power enable node and the second node, the power transistor to be driven based on the self bias voltage.

13. The circuit as claimed in claim 11, wherein the ground circuit includes:
a ground enable transistor connected between the ground voltage and a ground enable node, the ground enable transistor to block a conduction path to the ground voltage in response to an inverted signal of a ground enable signal; and
a ground transistor connected between the ground enable node and the first node, the ground transistor to be driven based on the self bias voltage.

14. A memory device, comprising:
a memory core to store data or to output the stored data in response to one or more control signals;
a self bias buffer circuit to receive the data of the memory core or to transmit outside data to the memory core in response to the control signals; and
a controller is to control the memory core and the self bias buffer circuit by generating the control signals, the self bias buffer circuit including:

a buffer to provide a self bias voltage based on a reference voltage and to be driven based on the self bias voltage, the buffer to generate an output signal based on a comparison of an input signal and the reference voltage; and
a bias controller to boost the self bias voltage based on the reference voltage.

15. An apparatus, comprising:
a buffer to generate a bias voltage based on a reference voltage, and to generate an output signal based on a comparison of the reference voltage and an input voltage; and
a bias circuit to adjust the bias voltage based on the reference voltage,
wherein the reference voltage is set to a value based on a predetermined width of a data fetch window, and wherein the predetermined width corresponds to a target operational speed of a memory device which includes or is coupled to the buffer.

16. The apparatus as claimed in claim 15, wherein the bias circuit is to adjust the bias voltage to change a width of the data fetch window to the predetermined width.

17. The apparatus as claimed in claim 16, wherein the predetermined width of the data fetch window corresponds to a desired margin of a set-up time or a hold time for a data latch operation.

18. The apparatus as claimed in claim 15, wherein the bias circuit is to adjust the bias voltage to cause the buffer to operate in a substantially symmetrical manner relative to the reference voltage.

19. The apparatus as claimed in claim 15, wherein the buffer includes:
a first differential circuit to generate an initial value of the bias voltage based on the reference voltage, and
a second different circuit to generate the output signal based on a comparison of the reference voltage and the input voltage, wherein the first differential circuit is coupled to the second differential circuit.

20. The memory device as claimed in claim 14, wherein the buffer includes:
a differential circuit to generate the output signal and the self bias voltage based on the reference voltage and the input signal; and
a bias circuit to drive the differential circuit based on the self bias voltage.

* * * * *